US005834902A

United States Patent [19]

[11] Patent Number: 5,834,902

[45] Date of Patent: Nov. 10, 1998

Deurloo et al.

[54] DISCHARGE LAMP IGNITING AND OPERATING CURCUIT HAVING INTERFERENCE SIGNAL SUPPRESSION FROM 9 KHZ TO 100 MHZ

[75] Inventors: Oscar J. Deurloo; Stefan E. Roijers, both of Eindhoven, Netherlands

[73] Assignee: U.S. Philips Corporation, New York, N.Y.

[21] Appl. No.: 815,241

[22] Filed: Mar. 12, 1997

[30] Foreign Application Priority Data

Apr. 18, 1996 [EP] European Pat. Off. .............. 96201036

[51] Int. Cl.[6] .............................. H05B 37/00; H03H 7/00

[52] U.S. Cl. ................. 315/209 R; 315/219; 315/227 R; 333/167

[58] Field of Search ..................................... 333/181, 158, 333/12, 24 R, 25, 167; 315/244, 289, 209 R, 291, DIG. 5, 219, 227 R; 363/15, 20, 21

[56] References Cited

U.S. PATENT DOCUMENTS 4,323,824 4/1982 Roche et al. ............................ 315/289
4,410,837 10/1983 Suzuki et al. ........................... 315/289
5,513,088 4/1996 Williamson ............................... 363/20
5,568,041 10/1996 Hesterman .............................. 323/207

*Primary Examiner*—Robert J. Pascal
*Assistant Examiner*—David H. Vu
*Attorney, Agent, or Firm*—Edward Blocker

[57] ABSTRACT

A circuit arrangement for igniting and operating a discharge lamp is provided with input terminals for connecting a supply source, and a ground terminal, differential-mode and common-mode filters in which inductance and capacitance are incorporated, output terminals for connecting the discharge lamp, and a switch mode power supply connected to the input terminals and the output terminals by respective voltage conduction branches.

The circuit arrangement is characterized in that the input terminals and output terminals are connected both to one another and to the ground terminal by respective capacitive filters, in that a bead is included in one of the voltage conduction branches, and in that further common-mode capacitance is present between the inductance and the switch mode power supply. The requirements formulated in both EN55022 and EN55015 can be complied with in this manner.

6 Claims, 2 Drawing Sheets

DISCHARGE LAMP IGNITING AND OPERATING CURCUIT HAVING INTERFERENCE SIGNAL SUPPRESSION FROM 9 KHZ TO 100 MHZ

BACKGROUND OF THE INVENTION

1. Field of the Invention

The invention relates to a circuit arrangement for igniting and operating a discharge lamp, provided with

- first and second input terminals for connecting a supply source, and a ground terminal,
- differential-mode and common-mode filter means in which are incorporated inductive means and capacitive filter means,
- a switch mode power supply connected to the first and the second input terminal by means of a first and a second voltage conduction branch, respectively, and
- first and second output terminals for connecting the discharge lamp, which output terminals are connected to the switch mode power supply by means of a third and fourth voltage conduction branch, respectively.

2. Description of the Related Art

Such a circuit arrangement is known from electronic ballasts of the HF-B TLD and HF-P TLD types, make Philips, designed for igniting and operating fluorescent lamps, and ballast EMC 035-S01, make Philips, suitable for igniting and operating a high-pressure discharge lamp, in particular a metal halide lamp.

The filter means serve to ensure that the ballast complies with requirements known inter alia under the designation EN55015. It is achieved in this manner that the amount of interference signals occurring, especially in the frequency range from 9 kHz to 30 MHz, remains below a maximum admissible level under certain defined conditions.

The inductive means in the known ballast comprise mutually coupled first and second windings in the first and second voltage conduction branch, respectively, forming a common-mode coil and a separate inductance as a differential-mode coil. The separate inductance may be provided in one of the voltage conduction branches as a separate self-inductance. A technical equivalent is an embodiment in the form of two mutually coupled windings distributed over the two voltage conduction branches. The capacitive filter means comprise a differential-mode capacitor which connects the first and second voltage conduction branches and is placed between the common-mode coil and the differential-mode coil, and which at the same time forms a series circuit with a common-mode capacitor which also forms part of the capacitive filter means. The common-mode capacitor forms a connection between at least part of the inductive means and the ground terminal. The differential-mode capacitor with the differential-mode inductance forms a differential-mode filter, and the common-mode capacitor with the common-mode coil forms a common-mode filter. The common-mode capacitor in the known circuit arrangement is formed by a single capacitor. It is alternatively possible for the capacitive filter means to be formed by two capacitors, each connected to the ground terminal, while the first and second voltage conduction branches are each connected to one of the two capacitors.

Although the filter means of the known ballast constitute a satisfactory measure for complying with said requirements, it is found to be impossible by these means to have the circuit arrangement also comply with requirements according to EN55022 on the admissible quantity of interference in the frequency range from 30 MHz to 1 GHz. This is a problem. The invention has for its object to provide a measure for eliminating this problem.

SUMMARY OF THE INVENTION

According to the invention, a circuit arrangement of the kind mentioned in the opening paragraph is for this purpose characterized in that the input terminals as well as the output terminals are connected by means of the capacitive filter means both to one another and to the ground terminal, in that a bead is included in one of the voltage conduction branches, and in that further common-mode capacitive means are present between the inductive means and the switch mode power supply.

It was surprisingly found that the combination of the bead with the capacitive connections between the input and output terminals and the ground terminal renders it possible to comply with the requirements formulated in EN55022, while the further common-mode capacitive means also ensure that the standard EN55015 is still complied with. Preferably, the inductive means are constructed as first and second windings coupled with leakage in the first and second voltage conduction branches, respectively. The coupled inductance together with the further common-mode capacitive means thus forms part of the common-mode filter for the frequency range from 9 kHz to 30 MHz, while the leakage inductance forms part of the differential-mode filter.

A bead was found to be particularly suitable for counteracting interference signals at higher frequencies owing to the substantial absence of a parasitic capacitance. Particularly suitable beads for a high-frequency filter are ferrite beads having a comparatively high ohmic impedance for the frequency range from 30 MHz to 1 GHz. The operation of the differential-mode filter for the high-frequency range is further benefited when two beads are placed, which beads are arranged in different voltage conduction branches of mutually differing polarities.

The circuit arrangement is provided with an igniter circuit for generating ignition voltage pulses for igniting a high-pressure discharge lamp. Such a circuit is often provided with a primary winding of a pulse transformer of which a secondary winding is arranged in series with an output terminal. The pulse transformer provides for the upward transformation in the secondary winding of a pulse formed in the igniter circuit to a level suitable and sufficient for igniting the lamp. Preferably, the secondary winding is placed between a bead and the relevant output terminal. This advantageously prevents as much as possible that high-frequency signals caused by the ignition pulses form a load on the switch mode power supply. This is realized in a very advantageous manner in that the third and the fourth voltage conduction branches are both provided with a bead.

Usually and preferably, high-pressure discharge lamps are operated at a voltage of periodically alternating polarity. A circuit arrangement for igniting and operating such a lamp and provided with a switch mode power supply comprises a commutator for this purpose, which is connected to the third and fourth voltage conduction branches. The commutator will comprise at least two, often even four switching elements which are made conducting and non-conducting in alternation. It is preferable here that the beads are placed between the switching elements and the output terminals.

Usually, a switch mode power supply comprises a rectifier device for forming a DC voltage from the AC voltage delivered by the connected supply source. It is surprisingly achieved through the placement of the further common-mode capacitive means between the ground terminal and a DC voltage pole that any leakage current to earth through the further common-mode capacitive means will be considerably smaller than if the further common-mode capacitive means were connected to an AC voltage pole. This renders it possible to give the further common-mode capacitive means a higher capacitance value, which results in an improved common-mode filter action.

BRIEF DESCRIPTION OF THE DRAWINGS

The above and further aspects of the invention will be explained in more detail below with reference to a drawing of an embodiment of a circuit arrangement according to the invention, in which.

DESCRIPTION OF THE PREFERRED EMBODIMENTS

Figure 1:
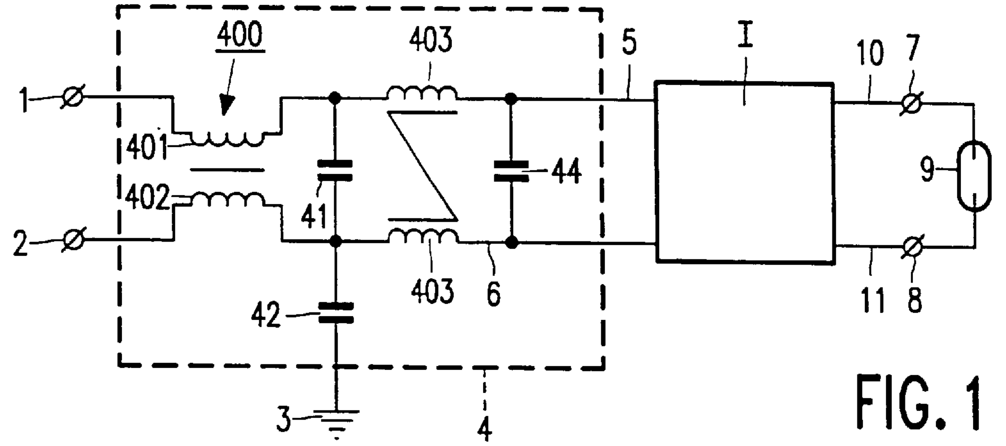
FIG. 1 is a circuit diagram of a circuit arrangement according to the prior art.

FIG. 1 shows a circuit arrangement for igniting and operating a discharge lamp 9. The circuit arrangement shown relates to a ballast suitable for operating a high-pressure discharge lamp, in particular a metal halide lamp, and provided with

- first and second input terminals 1, 2 for connecting a supply source, and a ground terminal 3,
- differential-mode and common-mode filter means 4 which include inductive means 400, 403 and capacitive filter means 41, 42, 44,
- a switch mode power supply I connected to the first and second input terminals via a first and a second voltage conduction branch 5, 6, respectively, and
- first and second output terminals 7, 8 for connecting the discharge lamp which output terminals are connected to the switch mode power supply via a third and fourth voltage conduction branch 10, 11, respectively.

The filter means 4 serve to achieve that the ballast complies with requirements known inter alia under the designation EN55015. It is ensured thereby that the amount of interference signals occurring, especially in the frequency range from 9 kHz to 30 MHz, remains below a maximum admissible level under certain defined conditions.

In the known ballast, the inductive means comprise mutually coupled first and second windings 401, 402 in the first and second voltage conduction branches, respectively, forming a common-mode coil and a separate inductance 403, in the form of two windings distributed over the two voltage conduction branches and mutually coupled, acting as a differential-mode coil. The capacitive filter means comprise a differential-mode capacitor 41 which interconnects the first and second voltage conduction branches and which is placed between the common-mode coil 400 and the differential-mode coil 403, and at the same time forms a series circuit with a common-mode capacitor 42 which also forms part of the capacitive filter means. The common-mode capacitor forms a connection between at least part of the inductive means and the ground terminal 3. The differential-mode capacitor 41 together with a further differential-mode capacitor 44 and the inductance 403 forms a differential-mode filter, while the common-mode capacitor 42 and the common-mode coil 400 form a common-mode filter. The common-mode capacitor in the known circuit arrangement is formed by a single capacitor.

Figure 2:
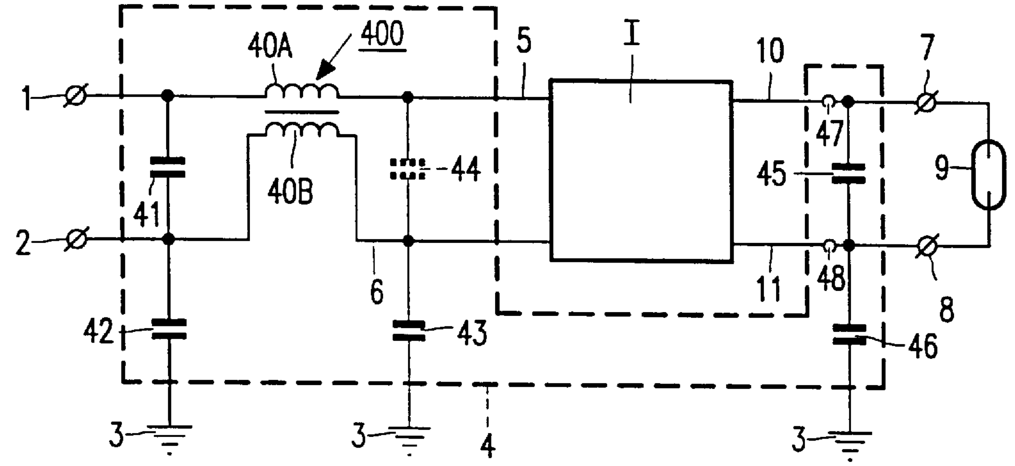
FIG. 2 is a circuit diagram of a circuit arrangement according to the invention.

The circuit arrangement shown in FIG. 2 is a circuit arrangement according to the invention. Parts corresponding to those of FIG. 1 have been given the same reference numerals. The inductive means are here constructed as first and second windings 40A, 40B coupled with leakage and arranged in the first and second voltage conduction branches, respectively. The coupled inductance together with the further common-mode capacitive means 42 thus forms part of the common-mode filter for the frequency range from 9 kHz to 30 MHz, whereas the leakage inductance forms part of the differential-mode filter. The input terminals 1, 2 and the output terminals 7, 8 are connected both to one another and to the ground terminal 3 via capacitive filter means 41, 42 and 45, 46, respectively. In addition, a bead 47, 48 (preferable a ferrite bead) is included in each of the voltage conduction branches 10, 11, while further common-mode capacitive means 43 is present between the inductive means 400 and the switch mode power supply I.

Figure 3:
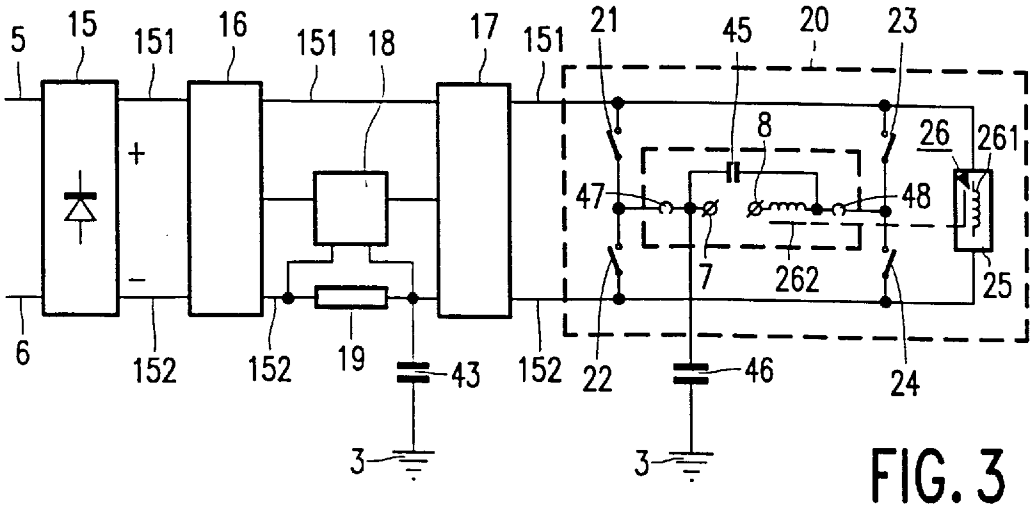
FIG. 3 shows part of the circuit arrangement of FIG. 2 in detail.

The switch mode power supply is shown in more detail in FIG. 3. The switch mode power supply comprises a rectifier device 15 for forming a DC voltage from the AC voltage delivered by the supply source connected, followed by a first DC-DC converter 16 and a second DC-DC converter 17. The converter 17 is subsequently connected to a commutator 20. The rectifier device 15, the DC-DC converters 16, 17, and the commutator 20 are interconnected by DC voltage conductors 151 and 152. The DC-DC converters are each provided with controlled switching means which are rendered conducting and non-conducting periodically by means of control signals generated in a control circuit 18. A measuring impedance 19 is included between the two DC-DC converters in the DC voltage conductor 152 for forming the control signals. Connection of the further common-mode capacitive means 43 between the measuring impedance and the DC-DC converter 17 advantageously achieves that the measuring impedance contributes to the generation of an interference signal to a negligibly low degree only. The commutator 20 which is connected to the third and fourth voltage conduction branches comprises four switching elements 21, 22, 23, 24 which are rendered conducting and non-conducting alternately. The commutator is further provided with an igniter circuit 25 for generating ignition voltage pulses. The circuit comprises a primary winding 261 of a pulse transformer 26 of which a secondary winding 262 is placed in series with output terminal 8 between output terminal 8 and filter capacitor 45. Bead 47 is here placed between the switching elements 21, 22 and the output terminal 7. Bead 48 is placed between the switching elements 23, 24 and the secondary winding 262.

In a practical realization of the described embodiment of the circuit arrangement, the circuit arrangement is suitable for igniting and operating a metal halide lamp, for example of the CDM 35 W type, make Philips, with a power rating of 39 W, designed for connection to a 220 V, 50 Hz supply source. The filter means are built up from the following components:

| windings 40 A, 40 B<br>bead 46, 47<br>capacitor | self-inductance 2*13 mH<br>leakage ind. 400 μH<br>BL02RN2, make Murata |
|---|---|
| 41 | 330 nF |
| 42 | 470 pF |
| 43 | 2.2 nF |
| 44 | 10 nF |
| 45 | 4.7 nF |
| 46 | 470 pF |

The first DC-DC converter 16 is an upconverter which forms a DC voltage of 400 V for supplying the second DC-DC converter 17 from the full-wave rectified supply voltage. The converter 17 is constructed as a Buck or downconverter and forms a controlled current generator during stable lamp operation. Lamp voltage is approximately 90 V during stable lamp operation. The controlled switching means of the two DC-DC converters are each rendered conducting and non-conducting alternately with a high frequency, in the range of 17 kHz to 0.2 MHz, during stable lamp operation. The switching elements of the commutator switch with a substantially constant frequency of 150 Hz so as to be conducting and non-conducting alternately. The secondary winding 262 of the pulse transformer 26 has 76 turns and accordingly has such a great parasitic capacitance that it plays no role of any importance in suppressing interference signals.

Figure 4A:
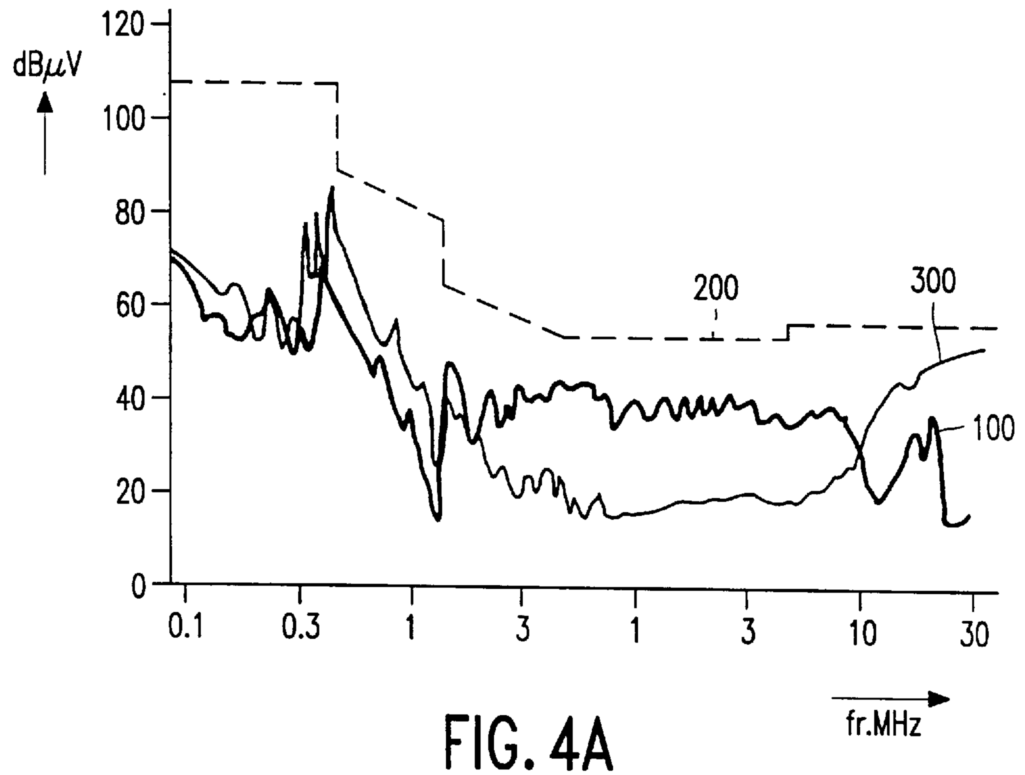
FIGS. 4A and 4B is a frequency diagram of an interference signal generated by the circuit arrangement of FIG. 2.
Figure 4B:
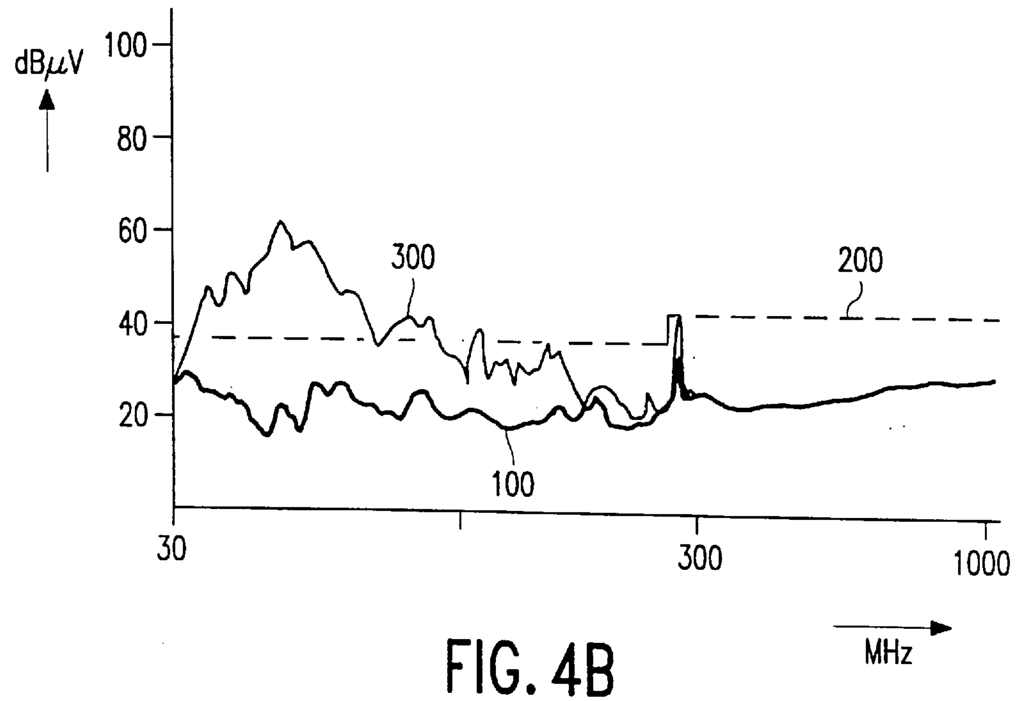

FIGS. 4A, B is a frequency diagram of the quantity of interference signal generated by the embodiment described during operation of a CDM 35 W lamp (make Philips with a nominal wattage of 39 W), measured by means of a peak measurement. The signal intensity is plotted in a usual unit on the vertical axis and the frequency on the horizontal axis. FIG. 4A shows the frequency range covered by the standard EN55015. FIG. 4B relates to the frequency range covered by the standard EN55022. The specific measuring technique suitable and indeed required for each frequency range may give rise to differences in value of the measured interference signal at the same frequency when measured in accordance with EN55015 or EN55022. Curve 100 represents the intensity of the measured signal and curve 200 is the maximum admissible intensity according to EN55015 and EN55022. Since curve 100 remains below curve 200 over the entire frequency range, it will be obvious that the circuit arrangement according to the invention complies with both standards EN55015 and EN55022. For comparison, curve 300 is shown representing the signal intensity when the known circuit arrangement is used.

We claim:

1. A circuit arrangement for igniting and operating a discharge lamp while suppressing interference signals in the range of about 9 kHz to 100 MHZ, comprising:

first and second input terminals for connecting a supply source, and a ground terminal, differential-mode and common-mode filter means which include inductive means and capacitive filter means, a switch mode power supply connected to the first and the second input terminal by means of a first and a second voltage conduction branch, respectively, for producing a periodic voltage for driving a discharge lamp, and first and second output terminals for connecting the discharge lamp, which output terminals are connected to the switch mode power supply by means of a third and fourth voltage conduction branch, respectively, characterized in that the capacitive filter means includes a first capacitance connecting the input terminals to each other, a second capacitance connecting at least one of the input terminals to the ground terminal, a third capacitance connecting the output terminals to each other, and a fourth capacitance connecting at least one of the output terminals to the ground terminal, in that a bead is included in one of the voltage conduction branches, and in that a further common-mode capacitive means is present between the inductive means and the switch mode power supply.

2. A circuit arrangement as claimed in claim 1, characterized in that two beads are placed, which beads are arranged in different voltage conduction branches of mutually differing polarities.

3. A circuit arrangement as claimed in claim 1, characterized in that the switch mode power supply is provided with a commutator comprising switching elements which are rendered conducting and non-conducting alternately, and in that the bead is placed between the switching elements and the output terminals.

4. A circuit arrangement as claimed in claim 1, characterized in that the circuit arrangement is provided with an igniter circuit for generating ignition voltage pulses, comprising a primary winding of a pulse transformer of which a secondary winding is connected in series with an output terminal, and in that the secondary winding is placed between the bead and one of the output terminals.

5. A circuit arrangement as claimed in claim 1, characterized in that the circuit arrangement is provided with an igniter circuit for generating ignition voltage pulses, comprising a primary winding of a pulse transformer of which a secondary winding is connected in series with one of the output terminals, and in that the secondary winding is placed between one of the output terminals and the respective capacitive filter means.

6. A circuit arrangement as claimed in claim 1, characterized in that the switch mode power supply comprises a rectifier device and a DC voltage conductor, and in that the further common-mode capacitive means is connected between the ground terminal and the DC voltage conductor.

* * * * *